United States Patent
Chiu et al.

(10) Patent No.: US 7,462,248 B2
(45) Date of Patent: Dec. 9, 2008

(54) METHOD AND SYSTEM FOR CLEANING A PHOTOMASK

(75) Inventors: Chih-Cheng Chiu, Taipei County (TW);
Ching-Yu Chang, Yilang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/671,570

(22) Filed: Feb. 6, 2007

(65) Prior Publication Data
US 2008/0185021 A1 Aug. 7, 2008

(51) Int. Cl.
*B08B 3/04* (2006.01)

(52) U.S. Cl. ............... 134/26; 134/2; 134/3; 134/25.4; 134/27; 134/28; 134/29; 134/34; 134/36; 134/41; 134/42; 134/902

(58) Field of Classification Search ............... 134/2, 134/3, 25.4, 26, 27, 28, 29, 34, 36, 41, 42, 134/902
See application file for complete search history.

(56) References Cited

U.S. PATENT DOCUMENTS

| | | | |
|---|---|---|---|
| 4,569,695 A * | 2/1986 | Yamashita et al. | 134/1 |
| 6,071,376 A * | 6/2000 | Nagamura et al. | 156/345.22 |
| 2002/0155360 A1* | 10/2002 | Tange et al. | 430/5 |
| 2003/0051740 A1* | 3/2003 | Chao et al. | 134/3 |
| 2007/0068558 A1* | 3/2007 | Papanu et al. | 134/29 |

* cited by examiner

*Primary Examiner*—Sharidan Carrillo
(74) *Attorney, Agent, or Firm*—Haynes and Boone, LLP

(57) ABSTRACT

A method for cleaning a photomask includes cleaning the photomask with a chemical cleaner, introducing a solution to the photomask, the solution is configured to react with residuals generated from the chemical cleaner to form insoluble precipitates, and rinsing the photomask with a fluid to remove the insoluble precipitates from the photomask.

18 Claims, 9 Drawing Sheets

METHOD AND SYSTEM FOR CLEANING A PHOTOMASK

BACKGROUND

The present disclosure relates in general to semiconductor manufacturing technology, and more particularly, to reducing or solving precipitate defects associated with photolithography photomasks.

Photomasks, or reticles, are commonly used for photolithography in semiconductor manufacturing. Photomasks are typically made from very flat pieces of quartz or glass with a layer of chromium deposited on one side. The pattern being used to transfer an image to a wafer on BIM (Binary Mask) or PSM (Phase Shift Mask) masks during a photolithography processing. While contamination of photomasks has always been a problem, high precision masks, such as are used in photolithography having wavelengths equal to or less than 248 nm, are particularly susceptible to defects.

One type of photomask contamination is referred to as haze contamination. Haze contamination is a precipitant formed from mask cleaning chemical residual or impurity of fab or tool environment cross exposure. For example, when a solution including ammonium ($NH_4$) and sulfate ($SO_4$) is used to clean a photomask, contamination becomes apparent when the photomask is exposed to a short wavelength UV light, such as 248 or 193 nm.

Therefore, what is needed is a simple and cost-effective method and system that minimizes haze contamination.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
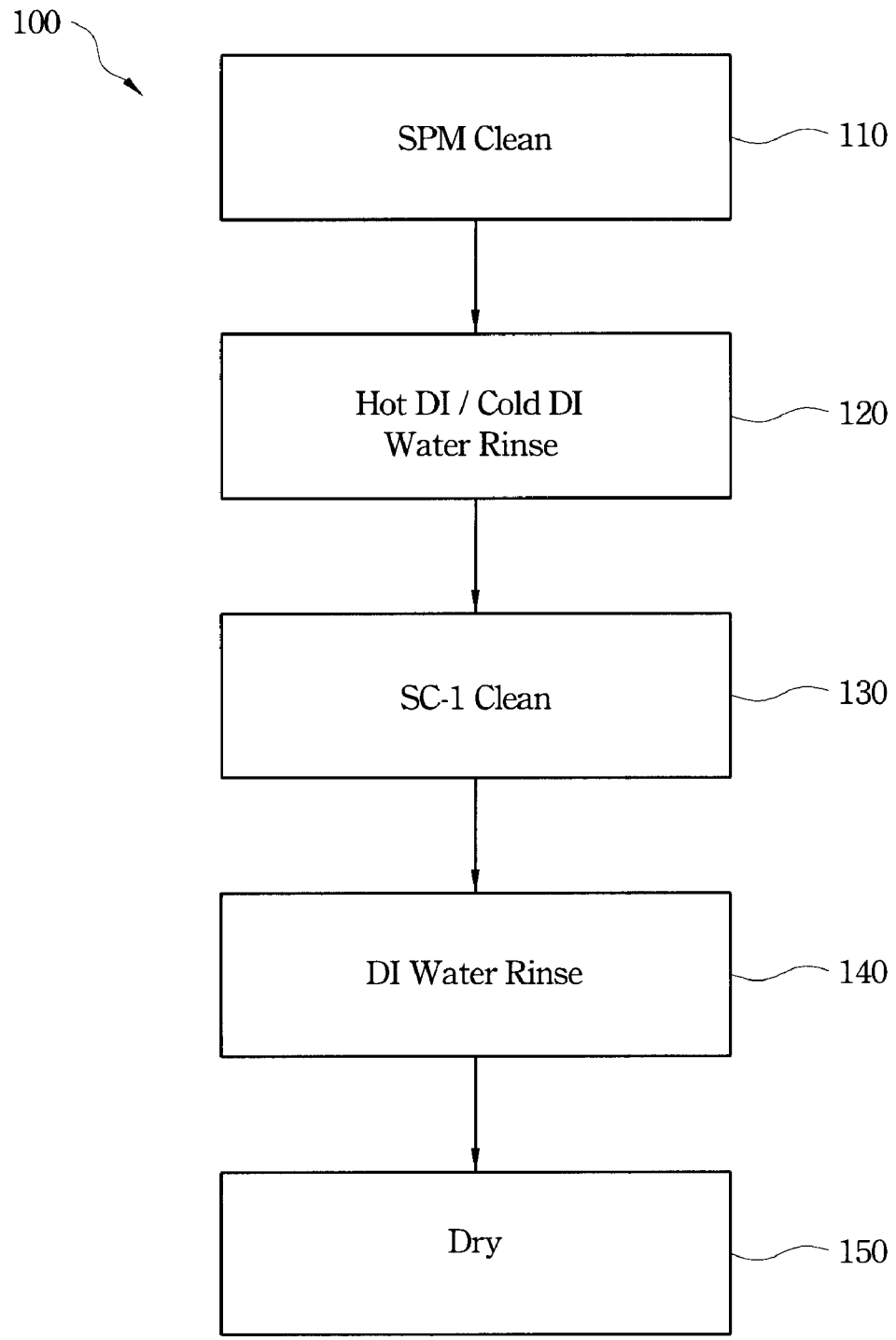
FIG. 1 is a block diagram of a conventional photomask cleaning process.

It is to be understood that the following disclosure provides different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

In semiconductor manufacture, a photomask or recticle is employed in photolithography for transferring an image of an electronic circuit onto a semiconductor wafer. The photomask may include a transparent substrate having fused quartz ($SiO$), calcium fluoride ($CaF_2$), or other suitable material. The photomask may further include an absorption layer formed on the transparent substrate (of the electronic circuit pattern), using chromium (Cr), iron oxide, or an inorganic film made with MoSi, ZrSiO, SiN, $MoSiON_x$, and/or TiN. The absorption layer may have a multilayer configuration. For example, the absorption layer may include an anti-reflective coating (ARC) layer.

The photomask may further include a pellicle having a transparent membrane and frame for protecting the photomask from damage and contamination. It is very important for the photomask to be clean and free of any contamination that may have been generated from the fab environment, photomask handling/storage, photomask fabrication, photomask pod out-gassing, pellicle frame residue, pellicle glue, or other semiconductor manufacture process. If there is any type of contamination on the photomask, it will cause defects when patterning the wafer.

Referring to FIG. 1, a conventional method 100 for cleaning a photomask or reticle is shown. The method 100 begins with step 110 in which the photomask may undergo a cleaning process with a chemical cleaner. The chemical cleaner may be a mixture of sulfuric acid ($H_2SO_4$) and hydrogen peroxide ($H_2O_2$) (commonly known as sulfuric peroxide mix (SPM)) which is used to remove organic particles or native oxides on the photomask. In this cleaning step 110, the SPM may be maintained at a temperature of about 90 degree C. and the photomask may be cleaned for approximately ten minutes. The method 100 continues with step 120 in which the photomask may undergo a rinsing process. The rinsing process may include a hot de-ionized water (DIW) rinse and/or a cold de-ionized water (DIW) rinse. The hot DIW rinse uses de-ionized water maintained at a temperature of about 60 degree C. and the photomask rinsed for approximately ten minutes. The cold DIW rinse uses de-ionized water maintained at about room temperature and the photomask rinsed for approximately ten minutes. It is understood that the temperatures and time periods disclosed herein are mere examples and that other temperatures and time periods may be employed.

The method 100 continues with step 130 in which the photomask undergoes another cleaning process with another chemical cleaner. The chemical cleaner may be a mixture of ammonium hydroxide ($NH_4OH$) and hydrogen peroxide ($H_2O_2$) (commonly known as an SC-1 or APM cleaning solution) which is used to remove inorganic particles on the photomask. The SC-1 cleaning solution may be maintained at a room temperature and the photomask cleaned for approximately ten minutes. Alternatively, the SC-1 cleaning process may optionally be used in combination with megasonic waves.

Figure 2A:
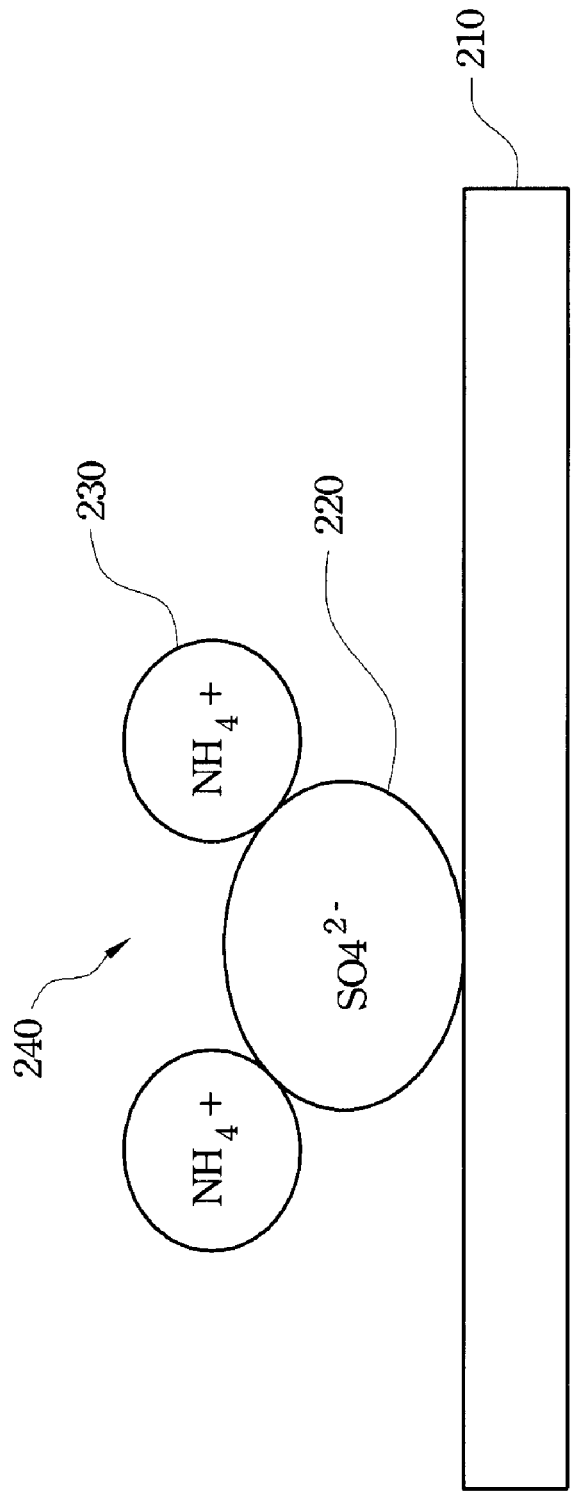
FIGS. 2a-2c are exploded cross-sectional views of a photomask undergoing part of the conventional cleaning process of FIG. 1 and developing haze contamination.
Figure 2B:
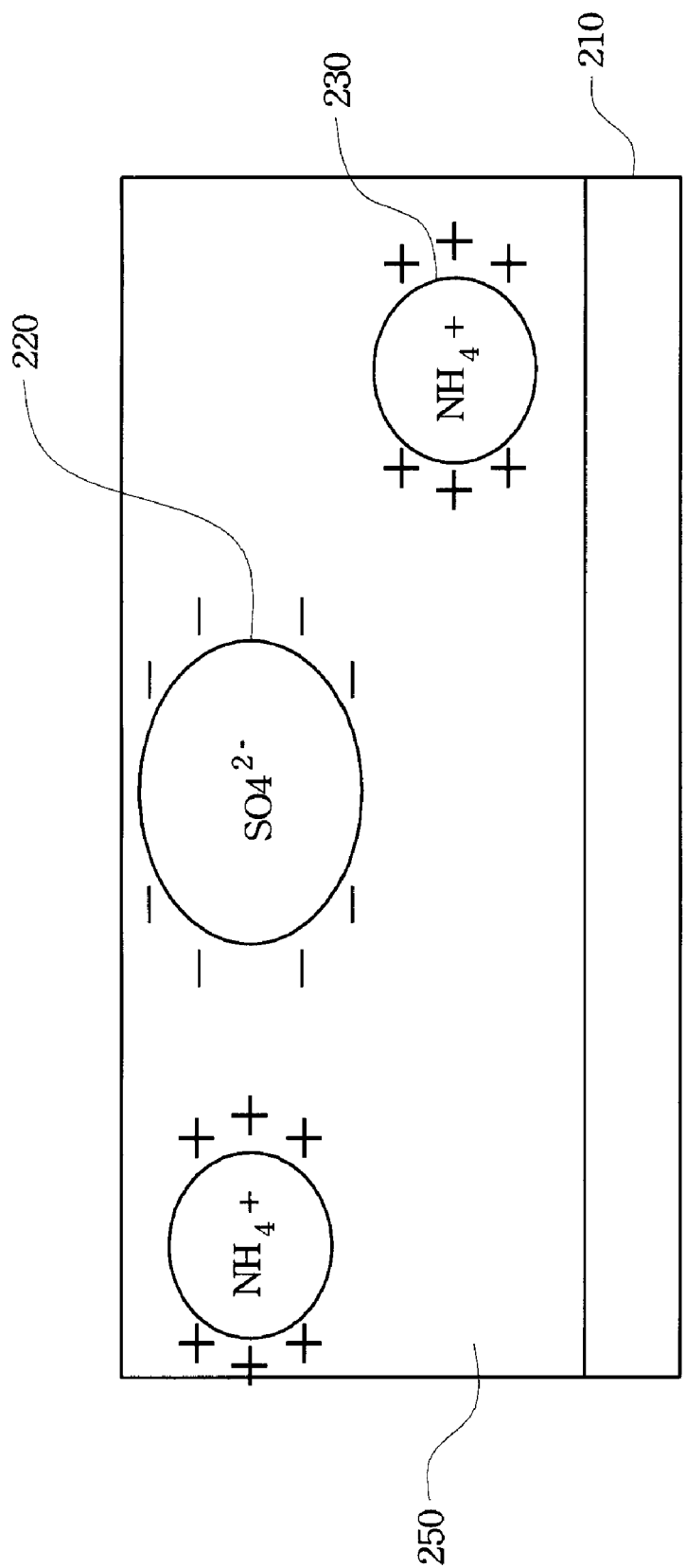
Figure 2C:
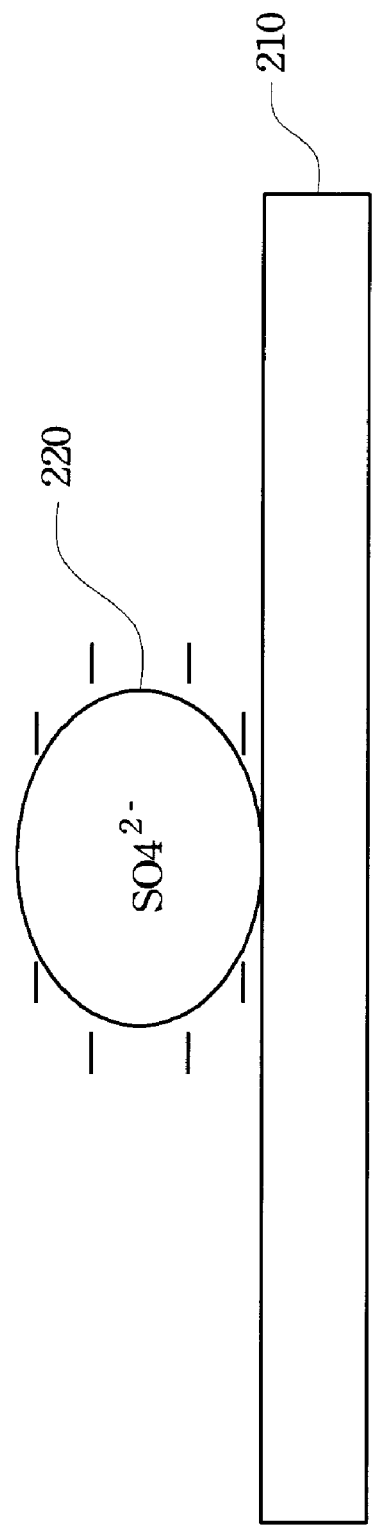

Now also referring to FIGS. 2a-2c, a photomask 210 is shown undergoing through part of the cleaning method 100 of FIG. 1 and developing haze contamination. In FIG. 2a, the photomask 210 is shown following step 130, as was described above. When the photomask 210 is cleaned with a solution based on chemicals such as sulfate (from step 110) and ammonium (from step 130), residual ions such as sulfate ions ($SO_4^{2-}$) 220 and ammonium ions ($NH_4^+$) 230 may be generated and may combine to form a precipitate 240 such as $(NH_4)_2SO_4$ on the photomask 210.

In FIG. 1 and FIG. 2b, the method 100 continues with step 140 in which the photomask 210 may undergo a de-ionized water rinse. The photomask 210 may be rinsed in de-ionized water 240 which causes the precipitate such as $(NH_4)_2SO_4$ to dissolve into sulfate ions $(SO_4^{2-})$ 220 and ammonium ions $(NH_4^+)$ 230. During the rinse, the de-ionized water 240 may be maintained at room temperature and the photomask rinsed for approximately ten minutes. In FIG. 1 and FIG. 2c, the method 100 continues with step 150 in which the photomask 210 may undergo a drying process. The drying process may be conducted with an inert or inactive gas such as nitrogen, oxygen, or argon. However, following the drying process of step 150, sulfate ions $(SO_4^{2-})$ 220 still remain on the photomask 210 as is shown in FIG. 3c.

It has been observed that sulfate and ammonium precipitates are the root causes that lead to crystal growth and haze contamination or formation. Additionally, as the photomask 210 is continuously used in the photolithography process, energy from a light source may accelerate the growth of these precipitated defects. For example, with a UV light source of 248 or 193 nm wavelength, precipitated defects can grow and/or deposit upon or near the photomask 210. These precipitated defects will limit the usage of the photomask and are large enough to result in printable defects on the semiconductor wafer during photolithography.

Figure 3:
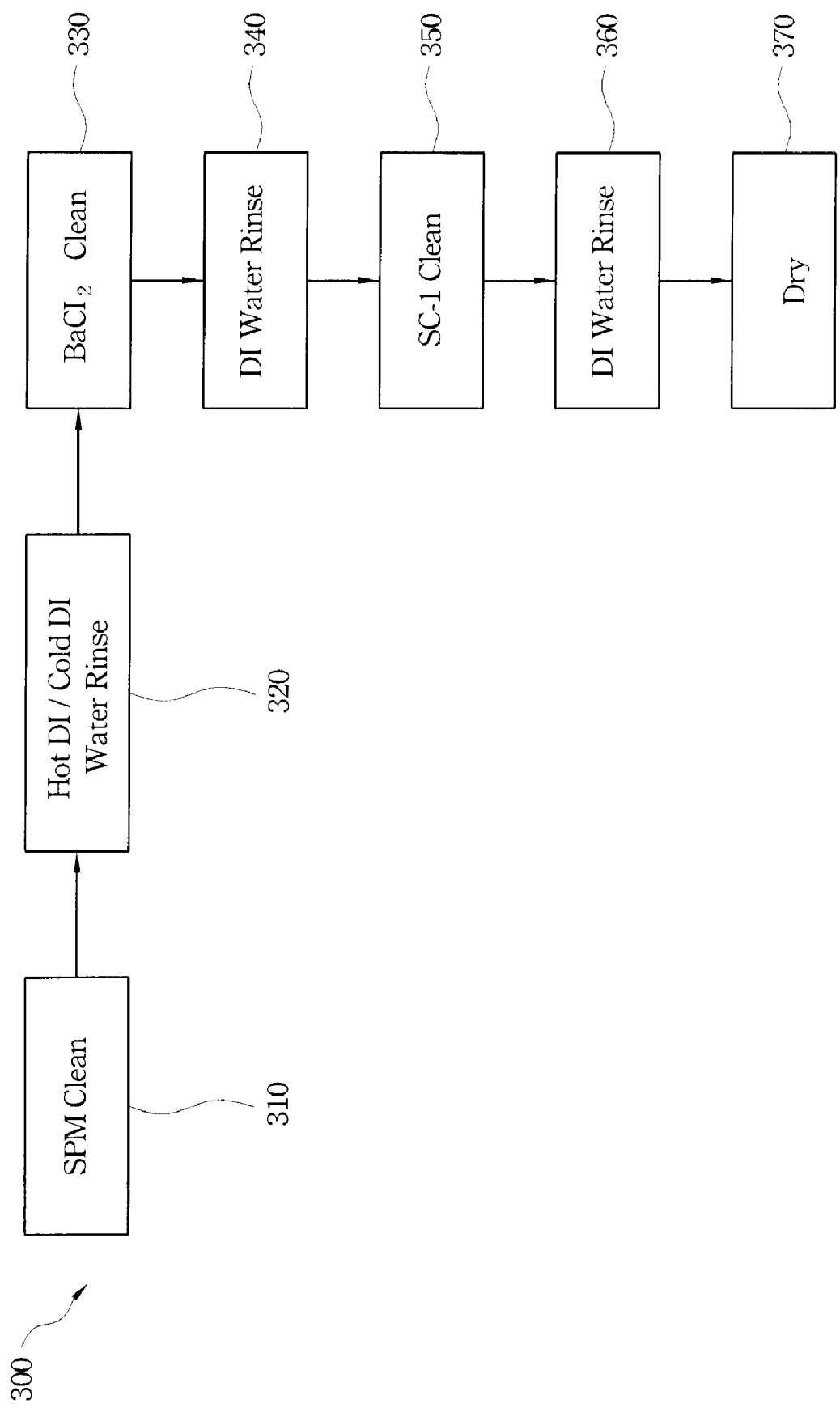
FIG. 3 is a block diagram of a photomask cleaning process according to one embodiment of the present disclosure.

Now referring to FIG. 3, in order to minimize the growth and deposition of these types of precipitated defects, a method 300 for cleaning a photomask according to one embodiment of the present disclosure is shown. Even though the photomask is used as an example in the present method, it is understood that the method is not limited to photomask cleaning and may be extended to cleaning other substrates having similar contamination issues.

The method 300 begins with step 310 in which the photomask may undergo a cleaning process with a chemical cleaner. The chemical cleaner may be a mixture of sulfuric acid $(H_2SO_4)$ and hydrogen peroxide $(H_2O_2)$ (commonly known as sulfuric peroxide mix (SPM)) which is used to remove organic particles or native oxides on the photomask. In this cleaning step 310, the SPM may be maintained at a temperature of about 90 degree C. and the photomask cleaned for approximately ten minutes. The method 300 continues with step 320 in which the photomask may undergo a rinsing process. The rinsing process may include a hot de-onized water (DIW) rinse and/or a cold de-ionized water (DIW) rinse. The hot DIW rinse uses de-ionized water maintained at a temperature of about 60 degree C. and the photomask rinsed for approximately ten minutes. The cold DIW rinse uses de-ionized water maintained at about room temperature and the photomask rinsed for approximately ten minutes. It is understood that the temperatures and time periods disclosed herein are mere examples and that other temperatures and time periods may be employed.

Figure 4A:
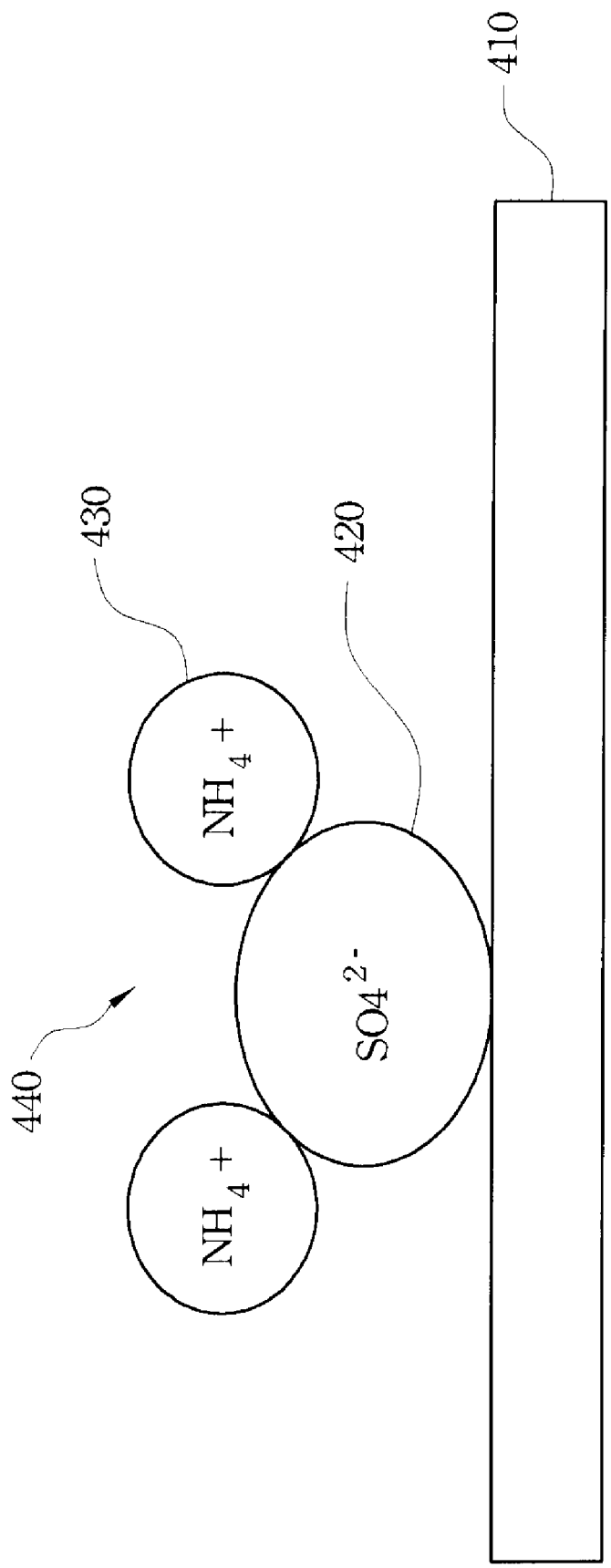
FIGS. 4a-4c are exploded cross-sectional views of a photomask undergoing the cleaning process of FIG. 3.
Figure 4B:
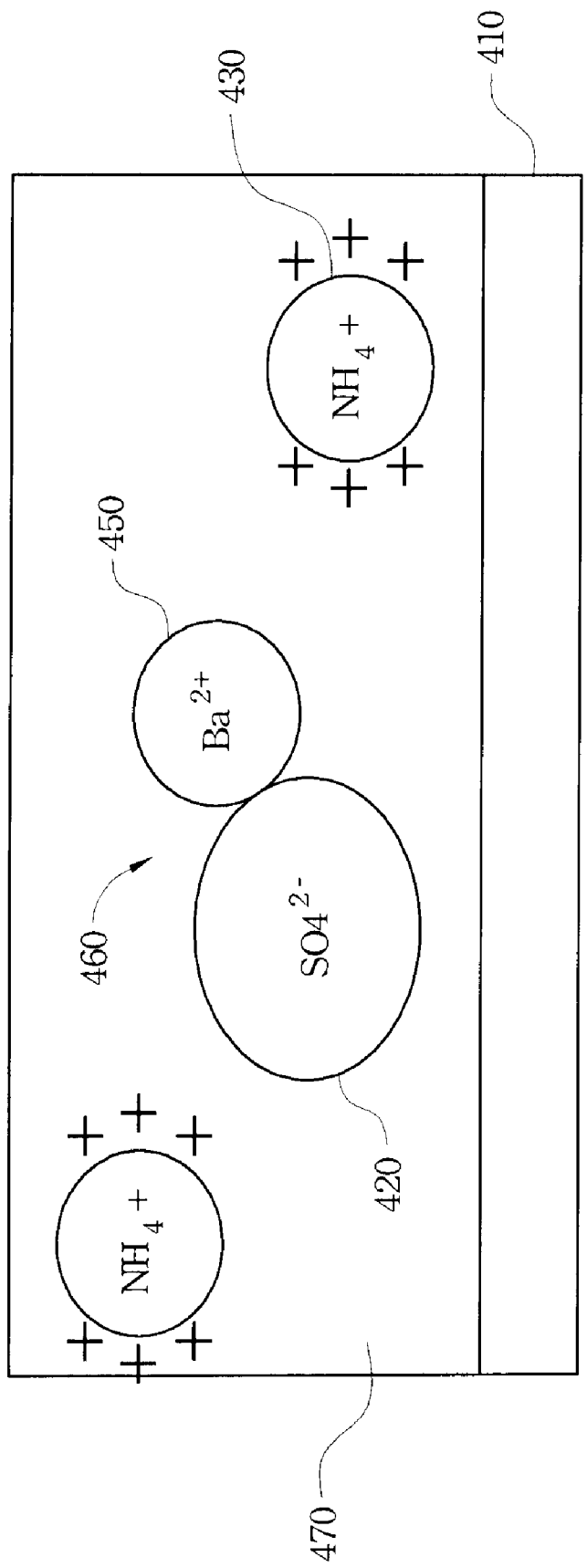
Figure 4C:
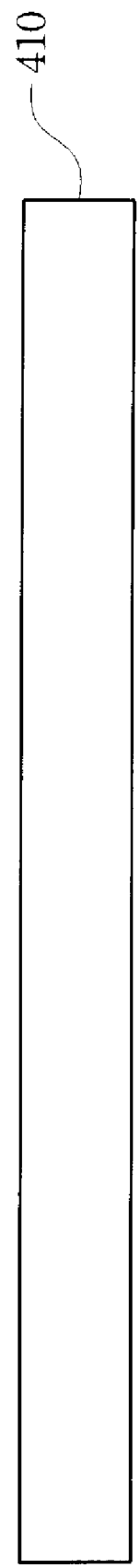

Now referring also to FIGS. 4a-4c, a photomask 410 is shown undergoing through part of the method 300 of FIG. 3. In FIGS. 3 and 4a, the photomask 410 is shown following step 320, as described above. As previously discussed, when the photomask 410 is cleaned with a solution based on chemicals such as sulfate and ammonium, residual ions such as sulfate ions $(SO_4^{2-})$ 420 and ammonium ions $(NH_4^+)$ 430 may be generated and may combine to form a precipitate 440 such as $(NH_4)_2SO_4$ on the photomask 210.

In FIGS. 3 and 4b, the method 300 continues with step 330 in which the photomask 420 may undergo a cleaning process with a chemical solution comprising an alkaline-earth metal such as barium (Ba). Alternatively, the alkaline-earth metal may optionally be magnesium (Mg), calcium (Ca), or strontium (Sr). For example, the chemical solution may comprise of barium chloride $(BaCl_2)$ having a concentration of 0.5 M (Molarity). Accordingly, since $BaCl_2$ is soluble, the chemical solution provides barium cations $(Ba^{2+})$ 450 (positively charged ions) and chlorine anions $(Cl^-)$ (negatively charged ions which are not shown). Alternatively, the anions of the chemical solution may optionally come from other halogens and/or other compounds so long as the metal cations such as barium $(Ba^{2+})$, magnesium $(Mg^{2+})$, calcium $(Ca^{2+})$, or strontium $(Sr^{2+})$ cations are generated in the chemical solution.

The chemical solution containing the metal cation may be maintained at a temperature of about 0 to 100 degree C. In the present embodiment, the chemical solution is maintained at a temperature of about 80 degree C. and the photomask 410 is subjected to the chemical solution for approximately ten minutes. The chemical solution causes the precipitate such as $(NH_4)_2SO_4$ to dissolve into sulfate ions $(SO_4^{2-})$ 420 and ammonium ions $(NH_4^+)$ 430. More importantly, the barium cations $(Ba^{2+})$ 450 react with and consume the sulfate ions $(SO_4^{2-})$ 420 to produce a thick white precipitate of barium sulfate $(BaSO_4)$ 460 which is insoluble. It is understood that the concentration, temperature, and time period disclosed herein are mere examples and that other concentrations, temperatures, and time periods may be employed depending on the chemical solution used. Additionally, it is contemplated that other types of metal cations may be used to react with the residual ions to produce an insoluble precipitate.

The method 300 continues with step 340 in which the photomask 410 may undergo a de-ionized water rinse. During this rinse, the de-ionized water 470 may be maintained at room temperature and the photomask 410 rinsed for a duration of approximately ten minutes. Because the barium sulfate $(BaSO_4)$ is insoluble, it is removed and washed-out from the photomask 410 by this rinsing process. Alternatively, the rinsing step 340 may optionally be performed with a base-type solution or a acid-type solution. The base-type solution may comprise of an ammonium, peroxide, and surfactant mixture. The acid-type solution may comprise of an organic acid, surfactant, and chelating agent mixture. These mixtures are well known in the art and, thus are not described in detail here.

The method 300 continues with step 350 in which the photomask 410 undergoes another cleaning process with another chemical cleaner. The chemical cleaner may be a mixture of ammonium hydroxide $(NH_4OH)$ and hydrogen peroxide $(H_2O_2)$ (commonly known as an SC-1 or APM cleaning solution) which is used to remove inorganic particles from the photomask 410. The SC-1 cleaning solution may be maintained at a temperature of about 90 degree C. and the photomask 410 cleaned for approximately ten minutes. Alternatively, the SC-1 cleaning process may optionally be used in combination with megasonic waves as was previously discussed. Because the sulfate ions $(SO_4^{2-})$ have been removed from the photomask 410 in step 340, there are minimal residual ions that remain on the photomask 410 after this cleaning step.

The method 300 continues with step 360 in which the photomask 410 may undergo another de-ionized water rinse. During this rinse, the de-ionized water may be maintained at room temperature and the photomask 410 rinsed for approximately ten minutes. In FIGS. 3 and 4c, the method 300 continues with step 370 in which the photomask 410 may undergo a drying process. The drying process may be conducted with an inert or inactive gas such as nitrogen, oxygen, or argon. At the end of the drying process, there are minimal sulfate and/or ammonium precipitates generated from the cleaning chemicals that remain on the photomask 410.

Optionally, a final rinse with de-ionized water may be performed after the drying process. For this final rinse, the de-ionized water may be maintained at a temperature of about 90 degree C. and the photomask rinsed for approximately two hours. It is understood that the temperature and time periods disclosed herein are mere examples and that other temperatures and time periods may be employed.

Figure 5:
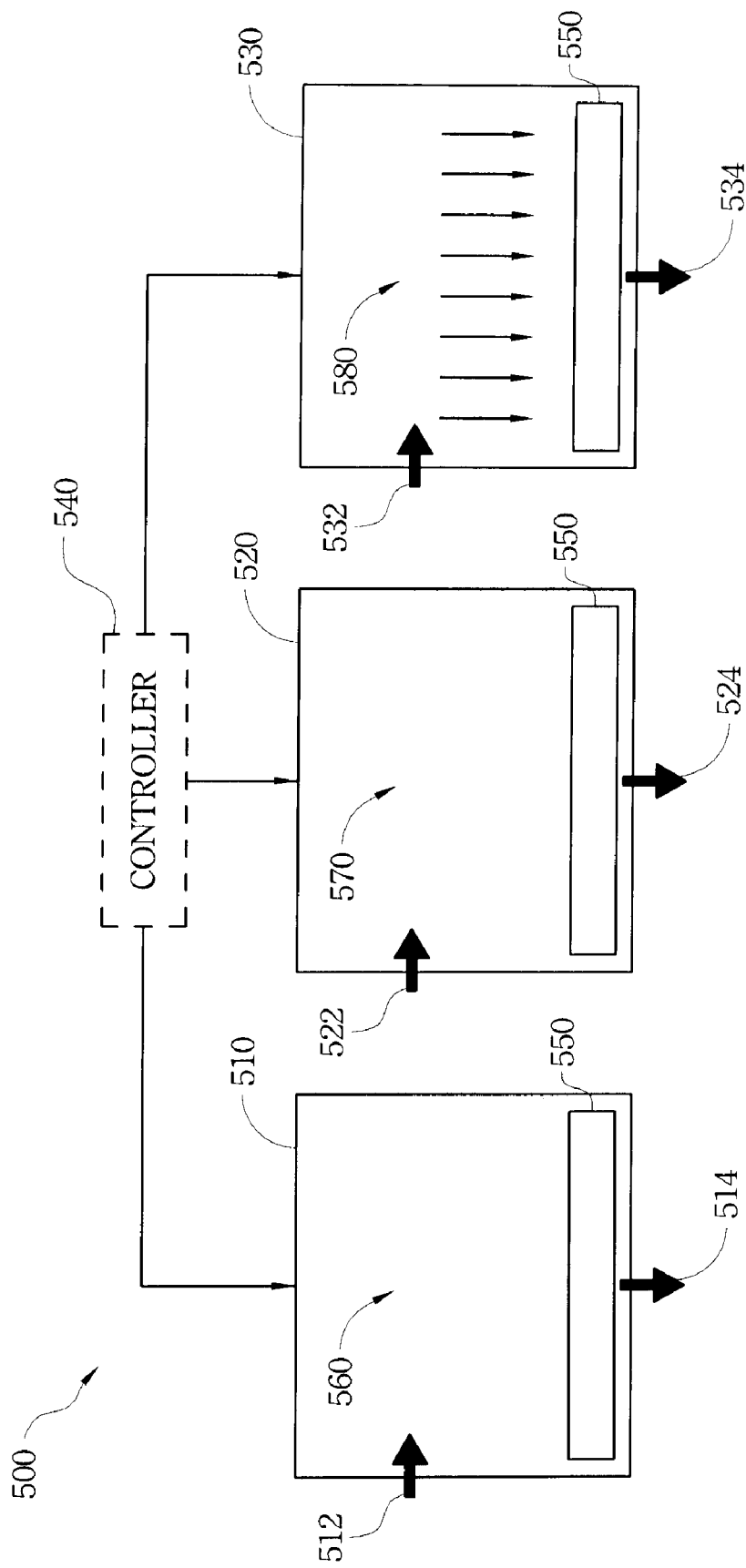
FIG. 5 is a cross-sectional view of a system for implementing the cleaning process of FIG. 3.

Now referring to FIG. 5, a system 500 for implementing the method 300 of FIG. 3 is shown. The system 500 includes a cleaning module 510, a rinsing module 520, a drying module 530, and a controller 540. The cleaning module 510, rinsing module 520, and drying module 530 each include an inlet 512, 522, 532 and an outlet 514, 524, 534. These inlets 512, 522, 532 and outlets 514, 524, 534 are used to allow fluid movement in and out of their respective modules 510, 520, 530. The controller 540 may control the operating environment for each of the modules 510, 520, 530 in order to perform the method 300 of FIG. 3.

For example, the cleaning module 510 may be configured and operable, by the controller 540, to perform a cleaning process of step 310. A photomask 550 may be secured in the cleaning module 510. The controller 540 controls a flow of a cleaning chemical such as SPM 560 through the inlet 512, the temperature and time required for the cleaning process as was previously discussed, and the flow of SPM through the outlet 514. As another example, the cleaning module 510 may be configured and operable, by the controller 540, to perform a cleaning process of step 330. The photomask 550 may be secured in the cleaning module 510. The controller 540 controls a flow of a chemical solution including barium chloride ($BaCl_2$) through the inlet 512, the temperature and time required for the cleaning process as was previously discussed, and the flow of the chemical solution through the outlet 514. As another example, the cleaning module 510 may be configured and operable, by the controller 540, to perform a cleaning process of step 350. The photomask 550 may be secured in the cleaning module 510. The controller 540 controls an SC-1 cleaning solution through the inlet 512, the temperature and time required for the cleaning process as was previously discussed, and the flow of the SC-1 cleaning solution through the outlet 514.

For example, the rinsing module 520 may be configured and operable, by the controller 540, to perform a rinsing process of steps 320, 340, and 360. A photomask 550 may be secured in the rinsing module 520. The controller 540 controls a flow of fluid such as de-ionized water 570 through the inlet 522, the temperature and time required for the rinsing process as was previously discussed, and the flow of de-ionized water through the outlet 524.

For example, the drying module 530 may be configured and operable, by the controller 540, to perform the drying process of step 370. A photomask 550 may be secured in the drying module 510. The controller 540 controls a flow of an inert or inactive gas 580, such as nitrogen, oxygen, or argon through the inlet 532, the temperature and time period required for the cleaning process as was previously discussed, and the inert or inactive gas through the outlet 534. Even though the system 500 is shown with three separate modules, it is understood that one or more modules may be combined and/or the processing steps implemented within a single module. Additionally, the controller 540 may be configured to control other operating parameters Thus, the present disclosure provides a method for cleaning a photomask. The method includes cleaning the photomask with a first chemical cleaner, introducing a solution to the photomask, the solution is configured to react with residuals generated from the first chemical cleaner to form an insoluble precipitate, and rinsing the photomask with a fluid to remove the insoluble precipitate from the photomask. In some embodiments, the first chemical cleaner includes a sulfuric peroxide mix (SPM). The solution includes a chemical compound that provides a metal cation. The metal cation is of a type selected from a group consisting of: magnesium (Mg), calcium (Ca), strontium (Sr), and barium (Ba). The solution is also maintained at a temperature between about 0 and 100 degree C.

In other embodiments, the rinsing includes configuring the fluid to be of a type selected from a group consisting of: de-ionized water (DIW), base-type solution, and acid-type solution. In some embodiments, the base-type solution comprises an ammonia, peroxide, and surfactant. In some embodiments, the acid-type solution comprises an organic acid, surfactant, and chelating agent. In still other embodiments, the method further comprises cleaning the photomask with a second chemical cleaner, rinsing the photomask with de-ionized water (DIW), and drying the photomask with an inert gas. In some embodiments, the second chemical cleaner includes an ammonia peroxide mixture (SC-1).

The present disclosure also provides a system for cleaning a photomask. The system comprises a cleaning module, a rinsing module, and a controller. The controller configures and operates the cleaning module to perform a cleaning process on the photomask with a solution containing a metal cation, the metal cation reacts with a contaminant on the photomask to form an insoluble precipitant. The controller configures and operates the rinsing module to perform a rinsing process on the photomask with a fluid to remove the insoluble precipitate. In some embodiments, the metal cation is of a type selected from a group consisting of: magnesium (Mg), calcium (Ca), strontium (Sr), and barium (Ba). In other embodiments, the fluid is of a type selected from a group consisting of: de-ionized water (DIW), base-type solution, and acid-type solution. In still other embodiments, the modules include an inlet and outlet for introducing and exhausting the solution required for the cleaning process and the fluid required for the rinsing process. In other embodiments, the system further comprises a drying module. The controller configures and operates the drying module to dry the photomask with an inert gas. The drying module includes an inlet and outlet for introducing and exhausting the inert gas.

The present disclosure provides in another embodiment a method for cleaning a substrate. The method includes cleaning the substrate with a sulfuric peroxide mix (SPM), subjecting the substrate with a solution containing a metal cation, the metal cation reacts with a residual that was generated from the SPM to produce an precipitate, rinsing the photomask with a fluid to remove the precipitate from the substrate, cleaning the substrate with an ammonia peroxide mix (SC-1), and thereafter, rinsing and drying the substrate. In some embodiments, the substrate is a photomask. In other embodiments, the metal cation is of a type selected from a group consisting of: magnesium (Mg), calcium (Ca), strontium (Sr), and barium (Ba). In still other embodiments, the residual includes a sulfate ion and the precipitate is insoluble.

Although embodiments of the present disclosure have been described in detail, those skilled in the art should understand that they can make various changes, substitutions, and alterations herein without departing from the spirit and scope of the present disclosure. For example, various processing steps of the described methods may be executed in a different order or executed sequentially, combined, further divided, replaced with alternate steps, or removed entirely. Furthermore, various functions illustrated in the methods or described elsewhere in the disclosure may be combined to provide additional and/or alternate functions. Accordingly, all such modifications are intended to be included within the scope of this disclosure.

Several different advantages exist from these and other embodiments. In addition to providing an efficient and cost-effective method for cleaning photomasks or reticles in semiconductor manufacture, the methods disclosed herein are applicable for cleaning other types of substrates with similar contamination issues. The methods disclosed herein may be implemented with current cleaning equipment and chemicals to minimize and/or prevent haze contamination of photomasks. As a result, the photomask repeating effect, the photomask cleaning frequency, and the dimension-on-mask loss after photomask cleaning are reduced. Furthermore, since more wafers can be produced from the same photomask, photomask life time and productivity are increased and, thus less photomasks are required to be reworked.

What is claimed is:

1. A method for cleaning a photomask, comprising:
   cleaning a photomask with a first chemical cleaner;
   introducing a solution to the photomask, wherein the solution is configured to react with residuals generated from the first chemical cleaner to form an insoluble precipitate; and
   rinsing the photomask with a fluid to remove the insoluble precipitate from the photomask;
   wherein the solution includes a metal cation that is of a type selected from a group consisting of: magnesium (Mg), calcium (Ca), strontium (Sr), and barium (Ba).

2. The method of claim 1, wherein the cleaning includes configuring the first chemical cleaner to include a sulfuric peroxide mix (SPM).

3. The method of claim 1, wherein the introducing includes maintaining the solution at a temperature between about 0 and 100 degree C. during contact with the photomask.

4. The method of claim 1, wherein the rinsing includes configuring the fluid to be of a type selected from a group consisting of: de-ionized water (DIW), base-type solution, and acid-type solution.

5. The method of claim 1, further comprising:
   cleaning the photomask with a second chemical cleaner;
   rinsing the photomask with de-ionized water (DIW); and
   drying the photomask with an inert gas.

6. The method of claim 4, wherein the base-type solution comprises an ammonia, peroxide, and surfactant.

7. The method of claim 4, wherein the acid-type solution comprises an organic acid, surfactant, and chelating agent.

8. The method of claim 5, wherein the cleaning includes configuring the second chemical cleaner to include an ammonia peroxide mixture (SC-1).

9. A method of cleaning a substrate, comprising:
   cleaning a substrate with a sulfuric peroxide mix (SPM);
   subjecting the substrate with a solution containing a metal cation, wherein the metal cation reacts with a residual that was generated from the SPM to produce a precipitate;
   rinsing the substrate with a fluid to remove the precipitate from the substrate;
   cleaning the substrate with an ammonia peroxide mix (SC-1); and
   thereafter, rinsing and drying the substrate.

10. The method of claim 9, wherein the substrate is a photomask.

11. The method of claim 10, wherein the metal cation is of a type selected form a group consisting of: magnesium (Mg), calcium (Ca), strontium (Sr), and barium (Ba).

12. The method of claim 11, wherein the residual includes a sulfate ion.

13. The method of claim 12, wherein the precipitate is insoluble.

14. A method for cleaning a photomask, comprising:
   cleaning the photomask with a first chemical cleaner that includes a sulfuric peroxide mix (SPM);
   subjecting the photomask with a solution containing a metal cation after cleaning the photomask with the first chemical cleaner; and
   rinsing the photomask with a fluid.

15. The method of claim 14, wherein the metal cation is of a type selected form a group consisting of: magnesium (Mg), calcium (Ca), strontium (Sr), and barium (Ba).

16. The method of claim 14, wherein the fluid is of a type selected from a group consisting of: de-ionized water (DIW), base-type solution, and acid-type solution.

17. The method of claim 14, further comprising:
   thereafter, cleaning the photomask with an ammonia peroxide mix (SC-1);
   rinsing the photomask with de-ionized water (DIW); and
   drying the photomask with an inert gas.

18. The method of claim 14, wherein the subjecting includes maintaining the solution at a temperature between about 0 to 100 degree C. during contact with the photomask.

* * * * *